(12) United States Patent
Yu et al.

(10) Patent No.: US 6,511,887 B1
(45) Date of Patent: Jan. 28, 2003

(54) METHOD FOR MAKING FET GATE OXIDES WITH DIFFERENT THICKNESSES USING A THIN SILICON NITRIDE LAYER AND A SINGLE OXIDATION STEP

(75) Inventors: Mo-chiun Yu, Taipei (TW); Syun-Ming Jang, Hsin-Chu (TW)

(73) Assignee: Taiwan Semiconductor Manufacturing Computer, Hsin-Chu (TW)

( * ) Notice: Subject to any disclaimer, the term of this patent is extended or adjusted under 35 U.S.C. 154(b) by 0 days.

(21) Appl. No.: 09/596,747

(22) Filed: Jun. 19, 2000

(51) Int. Cl.[7] .......................................... H01L 21/8234
(52) U.S. Cl. ........................ 438/275; 438/221; 438/225
(58) Field of Search ................................ 438/275, 276, 438/299, 221, 225, 438, 591, 769, 787, 788, 789

(56) References Cited

U.S. PATENT DOCUMENTS

| | | | |
|---|---|---|---|
| 4,945,068 A | | 7/1990 | Sugaya |
| 5,502,009 A | * | 3/1996 | Lin .............................. 438/275 |
| 5,668,035 A | | 9/1997 | Fang et al. .................. 438/239 |
| 5,880,041 A | | 3/1999 | Ong ............................. 438/773 |
| 5,926,741 A | | 7/1999 | Matsuoka et al. ........... 438/778 |
| 5,960,289 A | * | 9/1999 | Tsui et al. ................... 438/275 |
| 6,033,958 A | * | 3/2000 | Chou et al. .................. 438/275 |

* cited by examiner

Primary Examiner—David Nelms
Assistant Examiner—Dung Anh Le
(74) Attorney, Agent, or Firm—George O. Saile; Stephen B. Ackerman

(57) ABSTRACT

A method for making a dual-gate oxide field effect transistors is achieved. The method utilizes a patterned thin silicon nitride layer and a single rapid thermal oxidation step to form a thicker gate oxide for memory and peripheral circuits while forming a thin nitrogen rich gate oxide for high-performance logic circuits. After forming STI around the logic and memory call areas and removing any native oxide, a thin CVD silicon nitride layer is deposited. The $Si_3N_4$ is patterned to leave portions over the logic device areas. A single rapid thermal oxidation process is performed to grow a thicker gate oxide on the exposed memory areas while concurrently the $Si_3N_4$ is slowly converted to a nitrogen-rich oxide and forms a thinner gate oxide on the logic device areas. The thinner nitrogen-rich gate oxide also retards boron diffusion to make more stable devices.

19 Claims, 2 Drawing Sheets

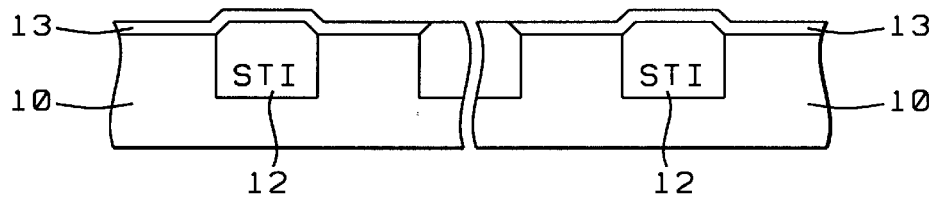
FIG. 1 – Prior Art
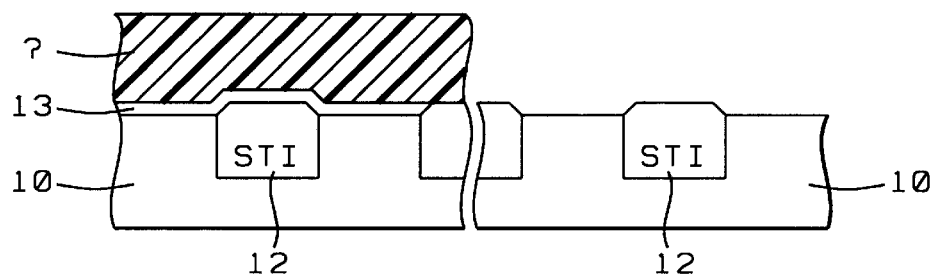
FIG. 2 – Prior Art
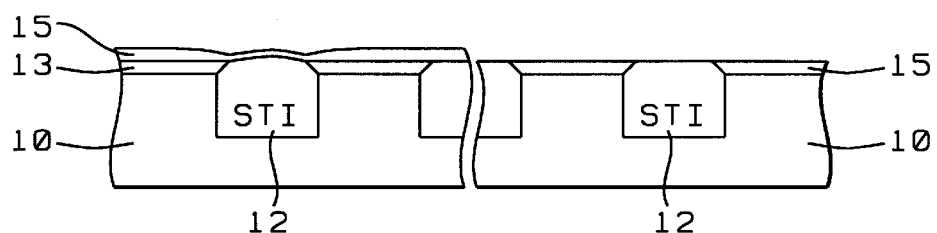
FIG. 3 – Prior Art
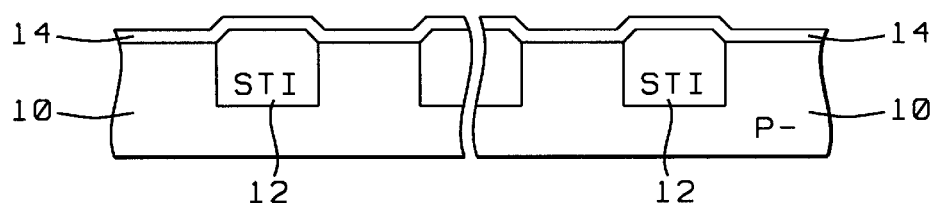
FIG. 4

1

METHOD FOR MAKING FET GATE OXIDES WITH DIFFERENT THICKNESSES USING A THIN SILICON NITRIDE LAYER AND A SINGLE OXIDATION STEP

BACKGROUND OF THE INVENTION

(1) Field of the Invention

This invention relates to semiconductor integrated circuit devices, and more particularly to a method for making field effect transistors (FETs) with different gate oxide thicknesses for various integrated circuit applications, such as forming a thicker tunnel oxide for non-volatile (flash) memory while providing a thinner gate oxide for high-performance logic circuits. The method uses a patterned thin silicon nitride ($Si_3N_4$) layer and a single oxidation step to provide a good quality thicker FET tunnel gate oxide while concurrently forming a good quality thinner FET gate oxide for the high-speed CMOS logic.

(2) Description of the Prior Art

Merged semiconductor logic and memory circuits are finding extensive use in the electronics industry for merged logic/memory devices. These deep submicrometer circuits require different gate oxide thicknesses to optimize the FET performance. Typically flash (non-volatile) memory and peripheral input-output (I/O) circuits require a thicker gate oxide, while CMOS logic circuits require a thinner gate oxide for increased performance (switching speed). For example, flash memory and peripheral circuits require a thicker oxide of 50 Angstroms or more and operate at a gate voltage of about 3.0 to 5.0 volts, while CMOS logic devices have effective gate oxides that are less than 25 Angstroms and operate at lower gate voltages (V) of between about 1.8 V and 2.5 V to achieve higher switching speeds.

One prior art method of achieving dual-thickness gate oxides for FETs is depicted in the schematic cross-sectional views of FIGS. 1 and 2. A field oxide 12 is formed in and on the silicon substrate 10 using conventional means to surround and electrically isolate the logic device areas L, as shown in the right potion of FIG. 1, and as shown in the left portion of FIG. 1 for the memory and peripheral device areas M. A first gate oxide 13 is grown on both the logic and memory/peripheral device areas. Next, as shown in FIG. 2, a photoresist mask 16 is used to mask the gate oxide 13 over the memory device areas M, and then a wet etch is used to remove the gate oxide 13 over the logic device areas L. The photoresist mask 16 is then removed by plasma ashing and/or by stripping in a photoresist stripper. Unfortunately, the photoresist 16 in direct contact with the thin gate oxide 13 on the silicon substrate 10 surface results in contamination that causes reliability problems. Next as shown in FIG. 3, prior to growing a thinner second gate oxide 15 on the logic device areas L, it is necessary to remove the native oxide in the logic device areas using a wet etch. However, the exposure of the first gate oxide 13 to the wet etch makes it difficult to accurately control the thickness of the thicker gate oxide, composed of oxide layers 13 and 15, over the memory device areas when the second oxidation step is performed.

Numerous methods of forming logic circuits with embedded memory devices having dual gate oxides have been reported in the literature. One method of making a dual-thickness gate oxide is described in U.S. Pat. No. 5,960,289 to Tsui et al. In Tsui's method a first gate oxide is deposited and a protection layer ($Si_3N_4$) is deposited. The two layers are then patterned to expose some of the device areas. The exposed device areas are oxidized to form a thin second gate oxide for high-performance circuits, while the first gate oxide and the protection layer serve as the thicker gate dielectric for the DRAM and the SRAM cells.

Sugaya in U.S. Pat. No. 4,945,068, teaches a method for forming a thick and thin dual-thickness gate oxide using only a single oxidation step. The method achieves the dual thickness by using an ion implant mask and implanting (injecting) nitrogen ($N_2$) ions into some of the silicon substrate device areas while masking from implant other device areas. A thermal oxidation is performed in which the oxide grows slower on the $N_2$ implanted areas than in non-implanted device areas.

Ong in U.S. Pat. No. 5,880,041 describes a method for using high-pressure oxidation to grow a gate oxide on a silicon substrate. The high pressure increases the oxidation rate (Angstroms/minute) and decreases the oxidation time, which reduces the thermal budget.

Fang et al. in U.S. Pat. No. 5,668,035 describe a method for forming a dual gate oxide for memory with embedded logic technology. The method grows a first gate oxide over memory and logic device areas. Then a polysilicon layer is deposited and patterned to expose the first gate oxide over the logic device areas and to protect the first gate oxide over the memory device areas. The first gate oxide is removed by wet etch over the logic device areas and a thinner second gate oxide is grown over the logic device areas.

Matsuoka et al. in U.S. Pat. No. 5,926,741 describe a method for forming a gate dielectric layer without generation of a natural oxide film. The method involves cleaning the silicon wafer in an inert gas ambient and replacing the ambient gas with an oxidizing gas and applying heat to form the gate oxide on the wafer.

However, there is still a need in the semiconductor industry for fabricating dual-thickness gate oxides using a simple cost-effective process, while preventing native oxides from forming on device areas, as well as avoiding boron penetration in the thin gate oxides for P-channel FETs.

SUMMARY OF THE INVENTION

It is a principal object of the present invention to form dual gate oxides on a single integrated circuit chip for field effect transistors (FETs) for making a thin effective gate oxide for high-performance logic circuits and a thicker gate oxide for non-volatile memory and/or peripheral circuits.

It is another object of the invention to use a patterned thin silicon nitride ($Si_3N_4$) layer to form the thin gate oxide while concurrently forming the thicker gate oxide using a single oxidation step.

A further objective of this invention is to use a single oxidation step to reduce processing complexity and to improve product reliability.

The method for making this dual gate oxide using a patterned thin $Si_3N_4$ layer for CMOS logic circuits and for non-volatile memory is now briefly described. The method begins by providing a semiconductor substrate. The substrate is typically a single-crystal silicon having a <100> crystallographic orientation. A field oxide is formed surrounding and electrically isolating CMOS logic device areas and memory device areas. Typically for these more advanced high-density integrated circuits, the field oxide is shallow trench isolation as commonly practiced in the industry. By the method of this invention the dual gate oxides are now formed by removing any native oxide that has inadvertently formed on the logic and memory device areas. Next a very thin blanket $Si_3N_4$ layer (e.g., 10–20 Angstroms) is deposited on the substrate using chemical vapor deposition (CVD). Preferably the native oxide is removed in situ just prior to depositing the $Si_3N_4$ layer to avoid reforming a native oxide. The $Si_3N_4$ layer is then patterned using a photoresist mask and a hot phosphoric acid ($H_3PO_4$) etch. The $Si_3N_4$ is patterned to leave portions over the logic device areas while exposing the surface of the memory and/or peripheral device areas. A key feature of this invention is that the photoresist mask used to pattern the $Si_3N_4$ does not come in direct contact with a gate oxide, as in the prior art. Therefore the gate oxide and/or the substrate are not contaminated by the photoresist. Any second native oxide that has inadvertently formed on the memory device areas is now removed in a dilute hydrofluoric (HF) acid solution or an HF vapor etch, while essentially leaving unetched the patterned $Si_3N_4$ over the logic device areas. The surface of the substrate is then subjected to a single oxidation step to form a thicker gate oxide (greater than or equal to 50 Angstroms) on the memory device areas, while concurrently converting the thin patterned $Si_3N_4$ layer to a nitrogen-rich $SiO_2$ layer having an effective oxide thickness of less than or equal to about 25 Angstroms over the logic device areas. The oxidation is carried out for a time sufficient to convert the $Si_3N_4$ to a nitrogen-rich $SiO_2$ and to partially oxidize the underlying surface of the silicon substrate to form a good interface. After completing this improved dual gate oxide, conventional processing is used to form FET devices. For example, the FET gate electrodes can be formed next by depositing and patterning a doped polysilicon layer or a polycide layer.

BRIEF DESCRIPTION OF THE DRAWINGS

FIGS. 1–3 show schematic cross-sectional views of a method for forming a thick and thin dual gate oxide by the prior art showing the limitations for controlling oxide thickness and photoresist contamination.

FIGS. 4 through 7 show schematic cross-sectional views for making a thick and thin dual gate oxide using a thin $Si_3N_4$ layer and a single oxidation step by the method of this invention.

DESCRIPTION OF THE PREFERRED EMBODIMENT

Figure 5:
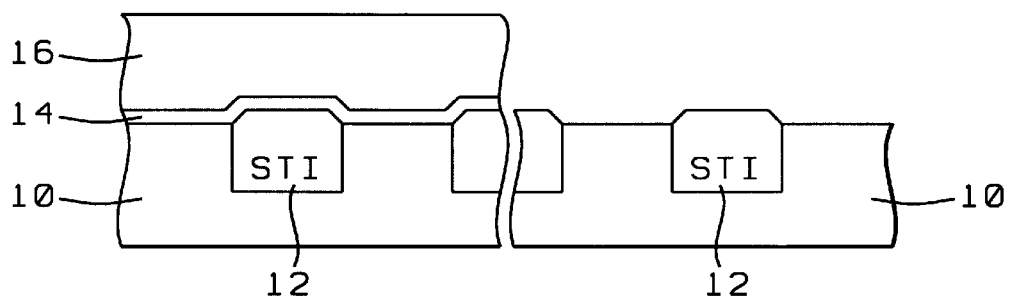

The method for making dual gate oxides having different thicknesses for deep sub-micron CMOS integrated circuits is now described in detail. The method uses a patterned thin $Si_3N_4$ layer and a single oxidation step to achieve the dual thicknesses of the gate oxides. Although the method is shown for making gate oxides for N channel FETs on a P substrate to simplify the discussion and drawings, it should also be understood by one skilled in the art that by including additional process steps, for example, by including N-well and P-well regions on a substrate, P-channel and N-channel FETs can be made from which Complementary Metal-Oxide-Semiconductor (CMOS) circuits can be formed. It should also be understood that while providing a thin gate oxide for improving the switching speed of the logic circuits, a thicker gate oxide is provided for improving higher voltage FET devices for peripheral input/output (I/O) buffer circuits, for flash (non-volatile) memory and the like on the chip.

Referring now to FIG. 4, the method begins by providing a substrate 10 having logic regions L for logic circuits and memory regions M which represent device areas for flash memory and the like. The memory regions are also representative of the type of gate oxide required for higher voltage I/O peripheral circuits. Typically for N-channel FETS, the substrate 10 is a P doped single-crystal silicon having a <100> crystallographic orientation. Field oxide regions 12 are formed surrounding and electrically isolating the device areas in both the logic regions L and the memory regions M. For advanced high-density circuits the preferred field oxide 12 is a Shallow Trench Isolation (STI), as is commonly practiced in the semiconductor industry. Generally the STI is formed by etching trenches in the field oxide areas on the substrate to a depth of between about 3000 and 5000 Angstroms. The trenches are filled with an insulating material, such as $SiO_2$, that is made planar with the surface of the substrate 10 using a planarizing etching back or by chemical-mechanical polishing (CMP).

Still referring to FIG. 4, and more specific to the method of this invention, the gate oxide having dual oxide thicknesses are now formed as now described. Any native oxide (not shown in the Fig.) that has inadvertently formed on the logic and memory device areas is removed. The preferred method for removing this first native oxide is by a hydrofluoric (HF) acid vapor etch in situ in the deposition tool to minimize the re-formation of a native oxide prior to depositing a $Si_3N_4$ layer. Alternatively the native oxide can be removed in an HF solution, typically made up of 1:100 HF to $H_2O$ by volume, just prior to loading the substrate (wafer) into a $Si_3N_4$ deposition tool. Next a thin blanket $Si_3N_4$ layer 14 is deposited on the substrate 10. The $Si_3N_4$ layer 14 is deposited by chemical vapor deposition using, for example, dichlorosilane ($SiCl_2H_2$) and ammonia ($NH_3$) as the reactant gas mixture. $Si_3N_4$ layer 14 is deposited to a preferred thickness of between about 10 and 20 Angstroms.

Referring now to FIG. 5, the $Si_3N_4$, layer 14 is patterned using a photoresist mask 16 and a wet etch to remove the $Si_3N_4$ over the device areas in the memory regions M, while protecting from etching the $Si_3N_4$ over the device areas in the logic regions L. Preferably the etching is carried out using a hot phosphoric acid ($H_3PO_4$) etchant, which prevents substrate damage, and the etching is typically carried out at a temperature of between about 100 and 200° C. A key feature of this invention is that the $Si_3N_4$ layer 14 prevents mobile ions from diffusing and protects the substrate from photoresist contamination during photoresist processing and etching. Also the gate oxide is not affected since it has not yet been formed on the silicon substrate 10, as in the prior art.

Figure 6:
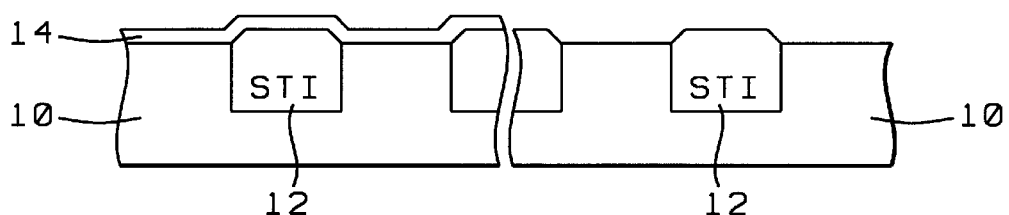

Referring to FIG. 6, the photoresist 16 shown in FIG. 5 is stripped by plasma ashing in $O_2$ and/or wet stripping. Any second native oxide (not shown) that may inadvertently have formed on the exposed memory device regions M is now removed. The second native oxide is removed similar to the removal of the first native oxide using a HF acid vapor etch in situ in the oxidation chamber (furnace) to minimize the re-formation of a native oxide. Alternatively any second native oxide can be removed in an HF solution, typically made up of 1:100 HF to $H_2O$ by volume, just prior to loading the substrate (wafer) into the oxidation chamber, while essentially leaving unetched the patterned $Si_3N_4$ layer 14 over the logic device areas L.

Figure 7:
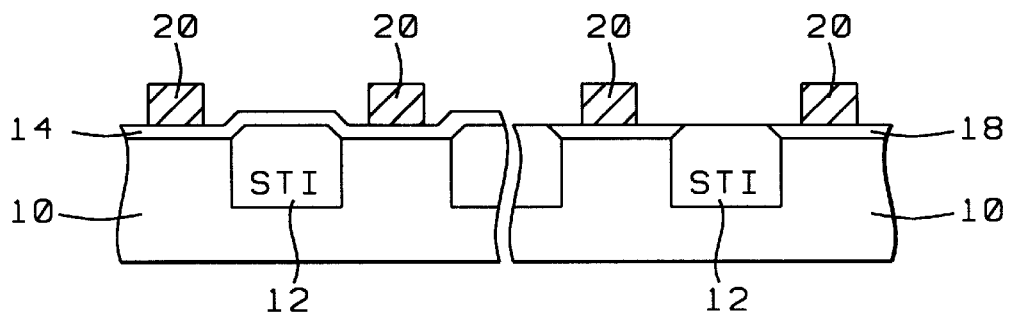

Referring to FIG. 7, the surface of the substrate 10 is then subjected to a single oxidation step to form a thicker gate oxide layer 18 (greater than or equal to 50 Angstroms) on the memory device areas M, while concurrently slowly converting the thin patterned $Si_3N_4$ layer 14 to a nitrogen-rich $SiO_2$ layer 14' having an effective oxide thickness (EOT) of less than or equal to about 25 Angstroms over the logic device areas L. The oxidation is carried out for a time sufficient to convert the $Si_3N_4$ to a nitrogen-rich $SiO_2$, commonly referred to as silicon oxynitride (SiON). The oxidation step is carried out for a sufficient time to partially oxidize the underlying surface of the silicon substrate 10 to form a good interface. The oxidation is preferably carried out in an oxidation furnace using a wet oxidation (steam oxidation). The preferred method is to perform a rapid thermal anneal at a temperature greater than 900° C. and for a time less than 3 minutes. This temperature and time can be adjusted to achieve the desired effective oxide thickness (EOT) of the SiON 14' for the desired electrical parameters. The nitrogen-rich SiON layer 14' also prevents boron diffusion on P-channel PET devices to improve electrical stability. After completing this novel, improved dual gate oxide, conventional processing can be used to form the FETs for the logic and memory devices. For example, the FET gate electrodes 20 can be formed next by depositing and patterning a doped polysilicon layer or a polycide layer.

While the invention has been particularly shown and described with reference to the preferred embodiment thereof, it will be understood by those skilled in the art that various changes in form and details may be made without departing from the spirit and scope of the invention.

What is claimed is:

1. A method for fabricating dual gate oxides on the same integrated circuit chip comprising the steps of:
   providing a semiconductor substrate having logic device areas and memory device areas surrounded and electrically isolated by field oxide regions;
   removing a first native oxide from said logic and memory device areas;
   depositing a blanket silicon nitride ($Si_3N_4$) layer on said substrate;
   patterning said $Si_3N_4$ layer leaving portions over said logic device areas and exposing surface of said memory device areas;
   removing a second native oxide from said memory device areas;
   oxidizing surface of said substrate to form a gate oxide on said memory device areas and concurrently to convert said $Si_3N_4$ layer to a nitrogen-rich silicon oxide layer on said logic device areas;
   depositing and patterning a polysilicon layer to form FET gate electrodes.

2. The method of claim 1, wherein said semiconductor substrate is single crystal silicon.

3. The method of claim 1, wherein said first and second native oxides are removed in a hydrofluoric acid solution.

4. The method of claim 1, wherein said silicon nitride is deposited by chemical vapor deposition using dichlorosilane and ammonia.

5. The method of claim 1, wherein said silicon nitride is deposited to a thickness of between about 10 and 20 Angstroms.

6. The method of claim 1, wherein said silicon nitride layer is patterned using a photoresist mask and a wet etch in a heated phosphoric acid ($H_3PO_4$) solution at a temperature of between about 100 and 200° C.

7. The method of claim 1, wherein said oxidizing of said surface is carried out using rapid thermal processing in steam at a temperature of at least 900° C.

8. The method of claim 1, wherein said gate oxide on said memory device areas is grown to a thickness of at least 50 Angstroms, while concurrently oxidizing said silicon nitride layer over said logic device areas to form said nitrogen-rich silicon oxide to a thickness of less than 25 Angstroms while completing said oxidation to said substrate surface.

9. The method of claim 1, wherein said polysilicon layer is conductively doped and is patterned by using a photoresist mask and plasma etching.

10. The method of claim 1, wherein said polysilicon layer includes an upper metal silicide layer to improve electrical conductivity.

11. A method for fabricating dual gate oxides on the same integrated circuit chip comprising steps of:
    providing a single-crystal silicon semiconductor substrate having logic device areas and memory device areas surrounded and electrically isolated by field oxide regions;
    removing a first native oxide from said logic and memory device areas;
    depositing a blanket silicon nitride ($Si_3N_4$) layer on said substrate;
    patterning said $Si_3N_4$ layer leaving portions over said logic device areas and exposing surface of said memory device areas;
    removing a second native oxide from said memory device areas;
    oxidizing surface of said substrate rapid thermal processing and forming a gate oxide on said memory device areas and concurrently converting said $Si_3N_4$ layer to a nitrogen-rich silicon oxide layer on said logic device areas;
    depositing and patterning a polysilicon layer to form FET gate electrodes.

12. The method of claim 11, wherein said first and second native oxides are removed in a hydrofluoric acid solution.

13. The method of claim 11, wherein said silicon nitride is deposited by chemical vapor deposition using dichlorosilane and ammonia.

14. The method of claim 11, wherein said silicon nitride is deposited to a thickness of between about 10 and 20 Angstroms.

15. The method of claim 11, wherein said silicon nitride layer is patterned using a photoresist mask and a wet etch in a heated phosphoric acid ($H_3PO_4$) solution at a temperature of between about 100 and 200° C.

16. The method of claim 11, wherein said rapid thermal processing is carried out using steam at a temperature of at least 900° C.

17. The method of claim 11, wherein said gate oxide on said memory device areas is grown to a thickness of at least 50 Angstroms, while concurrently oxidizing said silicon nitride layer over said logic device areas to form said nitrogen-rich silicon oxide to a thickness of less than 25 Angstroms while completing said oxidation to said substrate surface.

18. The method of claim 11, wherein said polysilicon layer is conductively doped and is patterned by using a photoresist mask and plasma etching.

19. The method of claim 1, wherein said polysilicon layer includes an upper metal silicide layer to improve electrical conductivity.

* * * * *